(12) United States Patent
Vinet et al.

(10) Patent No.: US 7,425,509 B2
(45) Date of Patent: Sep. 16, 2008

(54) METHOD FOR FORMING PATTERNS ALIGNED ON EITHER SIDE OF A THIN FILM

(75) Inventors: Maud Vinet, Grenoble (FR); Simon Deleonibus, Claix (FR); Bernard Previtali, Grenoble (FR); Gilles Fanget, Reaumont (FR)

(73) Assignee: Commissariat a l'Energie Atomique, Paris (FR)

( * ) Notice: Subject to any disclaimer, the term of this patent is extended or adjusted under 35 U.S.C. 154(b) by 257 days.

(21) Appl. No.: 10/539,532

(22) PCT Filed: Dec. 16, 2003

(86) PCT No.: PCT/FR03/50179

§ 371 (c)(1), (2), (4) Date: Jun. 17, 2005

(87) PCT Pub. No.: WO2004/057671

PCT Pub. Date: Jul. 8, 2004

(65) Prior Publication Data
US 2006/0148256 A1 Jul. 6, 2006

(30) Foreign Application Priority Data
Dec. 17, 2002 (FR) .................................. 02 15980

(51) Int. Cl.
*H01L 21/311* (2006.01)
(52) U.S. Cl. ...................................... 438/700; 438/706
(58) Field of Classification Search .................. 438/692, 438/694, 700, 706, 710, 714, 401, 975
See application file for complete search history.

(56) References Cited

U.S. PATENT DOCUMENTS

| 5,013,681 | A |   | 5/1991 | Godbey et al. ................. 437/86 |
| 5,436,173 | A |   | 7/1995 | Houston ....................... 437/21 |
| 5,893,744 | A | * | 4/1999 | Wang .......................... 438/401 |
| 5,952,694 | A |   | 9/1999 | Miyawaki et al. ........... 257/347 |
| 6,184,104 | B1 | * | 2/2001 | Tan et al. ..................... 438/401 |
| 6,261,918 | B1 | * | 7/2001 | So ............................. 438/401 |

(Continued)

FOREIGN PATENT DOCUMENTS

JP            5267663        10/1993

OTHER PUBLICATIONS

International Search Report, PCT/FR 03/50179, Sep. 3, 2004 (4 pages).

*Primary Examiner*—Kin-Chan Chen
(74) *Attorney, Agent, or Firm*—Thelen Reid Brown Raysman & Steiner LLP

(57) ABSTRACT

A method for forming patterns which are aligned on either side of a thin film deposited on a substrate. The method includes depositing a first pattern layer on the thin film which may occur before or after the local etching of the thin film to form a first marking. The method includes etching the first pattern layer in order to form a first pattern and depositing a first bonding layer for covering the first marking and the first pattern. The method may include suppressing the substrate as well as etching the first bonding layer to form a second marking at the location of the first marking. The method includes depositing a second pattern layer, and etching the second pattern layer to form the second pattern.

16 Claims, 9 Drawing Sheets

U.S. PATENT DOCUMENTS

| | | | |
|---|---|---|---|
| 7,220,655 B1 * | 5/2007 | Hause et al. | 438/424 |
| 2002/0028528 A1 * | 3/2002 | Ohtaka | 438/48 |
| 2002/0076853 A1 | 6/2002 | Kramer et al. | 438/113 |
| 2005/0009298 A1 * | 1/2005 | Suzuki et al. | 438/459 |

* cited by examiner

METHOD FOR FORMING PATTERNS ALIGNED ON EITHER SIDE OF A THIN FILM

CROSS-REFERENCE TO RELATED APPLICATION

This application claims priority based on International Patent Application No. PCT/FR2003/050179, entitled "Method for Forming Patterns Aligned on Either Side of a Thin Film" by Maud Vinet, Simon Deleonibus, Bernard Previtali and Gilles Fanget, which claims priority of French Application No. 02/15980 filed on Dec. 17, 2002, and which was not published in English.

TECHNICAL FIELD AND PRIOR ART

The invention relates to a method for forming aligned patterns on either side of a thin film.

The invention more particularly applies to the manufacturing of components and three-dimensional micro-systems such as for example digital circuits of the memory circuit type.

Generally, in microelectronics technology on a semiconductor, markings are used for achieving alignment of patterns (transistor gates, metal contacts, metallization levels, etc.). These markings are used both in the case of optical lithography and in the case of electronic lithography.

In the case of electronic lithography, the alignment markings are generally square holes with small dimensions (for example, a surface of 8 $\mu m^2$ and a depth of 800 nm) provided in an insulation oxide which insulates the different components. They are read by the difference in intensity between electrons backscattered by the holes and those backscattered by the surface.

In the case of substrates of silicon on an insulator (SOI), the alignment markings for optical lithography are made in a substrate which is found under a buried oxide. In a first phase, etching of the semiconductor thin film which is found above the buried oxide is carried out, and in a second phase, the buried oxide is etched, in order to expose a large substrate surface. The markings are then directly etched in the substrate.

In order to form aligned patterns on both faces of a semiconductor thin film, it is necessary to position the patterns made on one face relatively to the patterns made on the other face.

According to the known art, in the case of optical lithography, making circuits having patterns on both faces of active silicon film, leads to an operation during which the original substrate in which the markings are etched, is removed. The markings therefore disappear with the substrate. In the case of electronic lithography, the markings made on an insulation oxide are filled with smoothing oxide. Upon removing the buried oxide, they are also consumed as all their surroundings are in oxide. In both cases, the markings which are used for positioning the patterns on a first face are totally removed. New markings have then to be created for making patterns on the second face. The markings created on the second face now can no longer be aligned with the patterns of the first face.

Different methods have been suggested in order to avoid this drawback.

Patent Application EP 513684 discloses alignment markings for achieving resumptions of contact on the rear face of a substrate. For this, a field area is etched in a silicon substrate. The substrate is then covered with insulator. The alignment markings are etched in the field area whereas the contact holes are etched in the area where the patterns should be formed. A metal layer is then deposited, and then etched in order to form the alignment markings and the holes of contacts. The rear face of the substrate is then thinned down until the alignment marking is found which allows the contact hole to be found again. It is then possible to again find on the rear face the position of patterns made on the front face. This technique however has several drawbacks, i.e.:

- obligation of using metal materials,
- obligation of keeping the same substrate,
- making essentially local structures (i.e., located at specific locations) on the rear face and therefore the impossibility of using the whole rear face (for example, it is not possible to perform ion implantation).

Another known method discloses an alignment of circuits in three dimensions. At the start, one has two substrates to be aligned. On the first substrate, the alignment markings are made at the cutting paths for example. At the second substrate, a hole is made which corresponds to the width of the cutting path, this hole then being filled with an insulating layer which is flattened. Both substrates are then bonded together by taking care to align the hole and the cutting path with the help of an infrared microscope. Next, the rear face of the second substrate is removed as far as the insulating layer which allowed the hole to be filled and the alignment marking is read with a microscope. A drawback of this method is the inadequacy of the precision of the alignment which is obtained with the infrared microscope ($\approx 1$ $\mu m$).

The invention does not have the aforementioned drawbacks.

DISCUSSION OF THE INVENTION

Indeed, the invention concerns a method for forming aligned patterns on either side of a thin film deposited on a substrate, the method comprising local etching of the thin film so as to form a first marking, characterized in that it comprises:

- depositing a first pattern layer on the thin film, the deposition of the first pattern layer preceding or following the local etching of the thin film,
- a first lithography step for defining a first pattern location, with alignment of the first pattern location relatively to the first marking,
- local etching of the first pattern layer in order to form a first pattern,
- depositing a first bonding layer for covering the first marking and the first pattern,
- turning over the obtained structure following the deposition of the first bonding layer,
- suppressing the substrate,
- a step for etching the first bonding layer in order to form a second marking at the location of the first marking,
- a step for depositing a second pattern layer,
- a second lithography step for defining a second pattern location, with alignment of the second pattern location relatively to the second marking, and
- a step for etching the second pattern layer in order to form the second pattern.

According to a further feature of the method according to the invention, turning over the structure is followed by a bonding step for bonding the first bonding layer with a second bonding layer which covers a transfer substrate.

According to still a further feature of the method of the invention, as the first and second bonding layers are oxide layers, bonding is molecular bonding.

According to still a further feature of the method of the invention, the second marking is transferred into the transferred substrate.

According to still a further feature of the method of the invention, local etching of the first and second pattern layers is plasma etching.

According to still a further feature of the method of the invention, the first and second pattern layers are layers of polycrystalline silicon or metal, or nitride, or silicon, or silica, or High-K material.

According to still a further feature of the method of the invention, the thin film is a semiconductor thin film.

According to still a further feature of the method of the invention, the semiconductor thin film is silicon, gallium arsenide or SiGe film.

According to still a further feature of the method of the invention, local etching of the semiconductor thin film is either wet chemical etching or anisotropic plasma etching.

According to still a further feature of the invention, the method comprises a step for forming a first gate oxide layer between the semiconductor thin film and the first pattern layer and the step for depositing the second pattern layer is preceded by the deposition of a second gate oxide layer on the semiconductor thin film.

According to still a further feature of the method of the invention, the first pattern and the second pattern are transistor gates.

According to still a further feature of the method of the invention, the thin film is a metal thin film.

According to still a further feature of the method of the invention, the metal thin film is a TiN or W film.

According to still a further feature of the method of the invention, the first and second lithography steps are optical or electronic lithography steps.

According to still a further feature of the invention, the method comprises forming a buffer layer buried between the thin film and the substrate.

According to still a further feature of the method of the invention, the buried buffer layer is a $SiO_2$, SiGe or $Ni_3N_4$ layer.

SHORT DESCRIPTION OF FIGURES

Other features and advantages of the invention will become apparent upon reading a preferential embodiment made with reference to the appended figures wherein.

On all the figures, the same references designate the same components.

DETAILED DESCRIPTION OF EMBODIMENTS OF THE INVENTION

More particularly, the invention will be described in the case of alignment of gates of transistors located on either side of a thin film of silicon.

Generally, as already mentioned above, the invention concerns the alignment of any type of patterns (gates, sources, drains, metal interconnections, contacts, etc.) located on either side of a semiconductor or metal thin film.

FIGS. 1-11 illustrate different steps of a first embodiment of the method for forming aligned patterns according to the invention.

Figure 1:
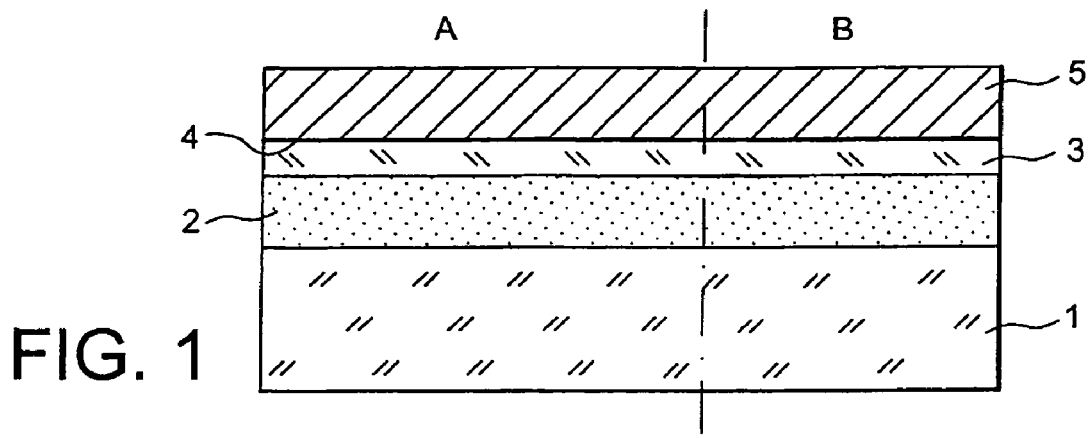
FIGS. 1-11 illustrate different steps of a first embodiment of the method for forming aligned patterns according to the invention.
Figure 2:
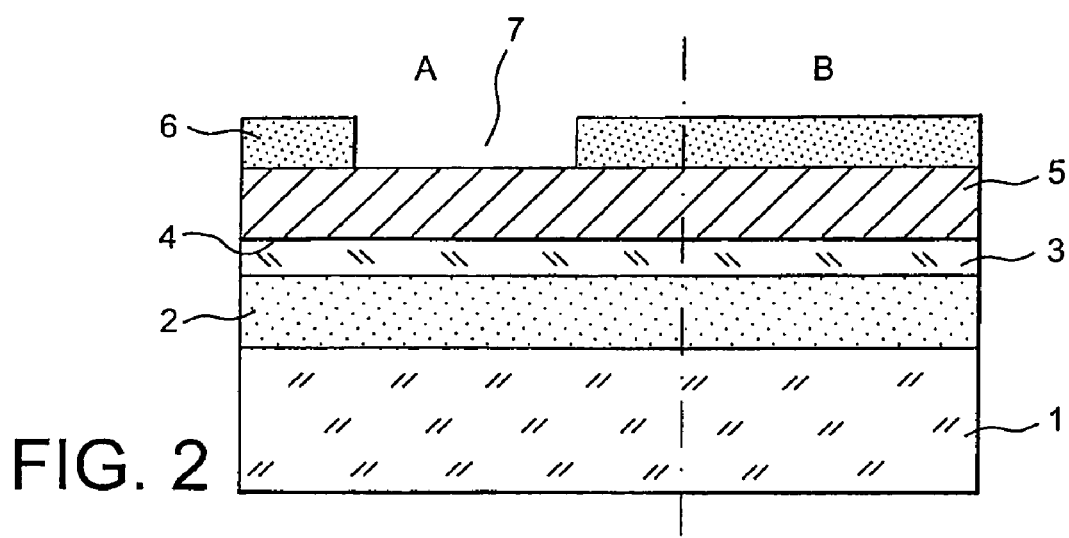
Figure 3:
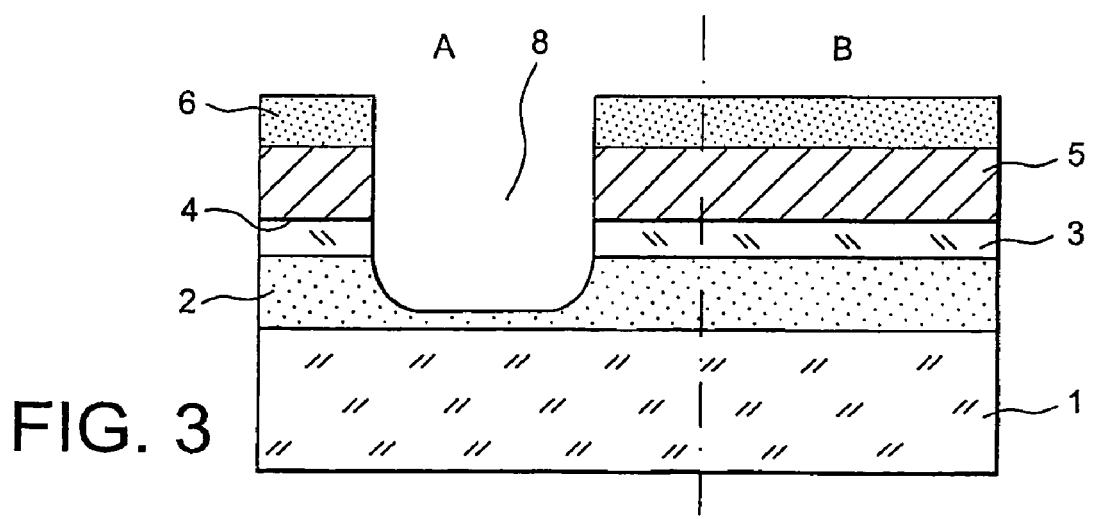

FIG. 1 illustrates an SOI (Silicon On Insulator) type structure consisting of a stack of layers deposited on a substrate 1, i.e.: a buried buffer layer 2, a thin silicon layer 3, a first gate oxide layer 4, and a first pattern layer 5. Two areas may be distinguished in the SOI structure: a first area A in which the markings will be made, and a second area B in which the patterns aligned with the markings will be made.

The first pattern layer 5 has chemical etching selectivity relatively to silicon oxide. As this will appear subsequently, layer 5 is a layer in which the first pattern is formed. Generally, the first pattern layer 5 may for example be a layer of polycrystalline silicon, of metal, of silicon nitride ($Si_3N_4$), a High-K (also known as High-K dielectric) material or of gate insulator topped with a stack of gate layers.

A resin layer 6 is first of all deposited on the first pattern layer 5. The resin layer 6 is locally etched in order to expose in the A area, a cavity 7 which defines the position of an alignment marking (cf. FIG. 2).

Anisotropic plasma etching of the layer 5, of the first gate oxide layer 4 and of the thin film 3 of silicon, is then carried out to form a marking 8. This anisotropic plasma etching step is followed by a wet chemical etching step or an anisotropic plasma etching step selective with respect to the silicon which transfers the marking 8 as far as into the buried buffer layer 2 (cf. FIG. 3). The resin layer 6 which belongs to the B portion of the SOI structure provides protection of the layer 5 of the B portion during the etching operation.

Figure 4:
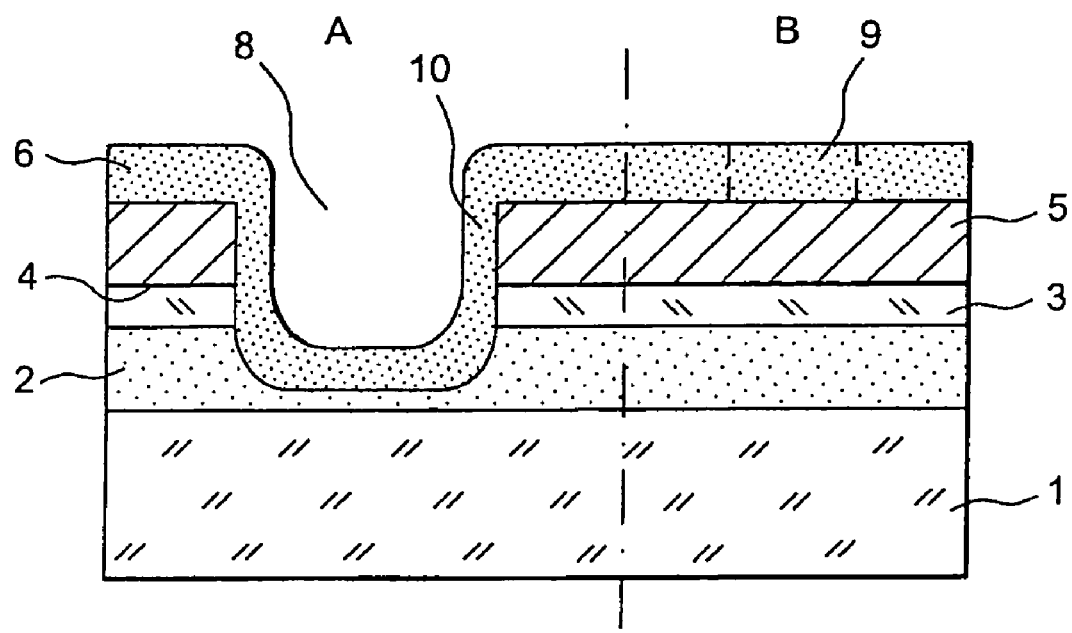
Figure 5:
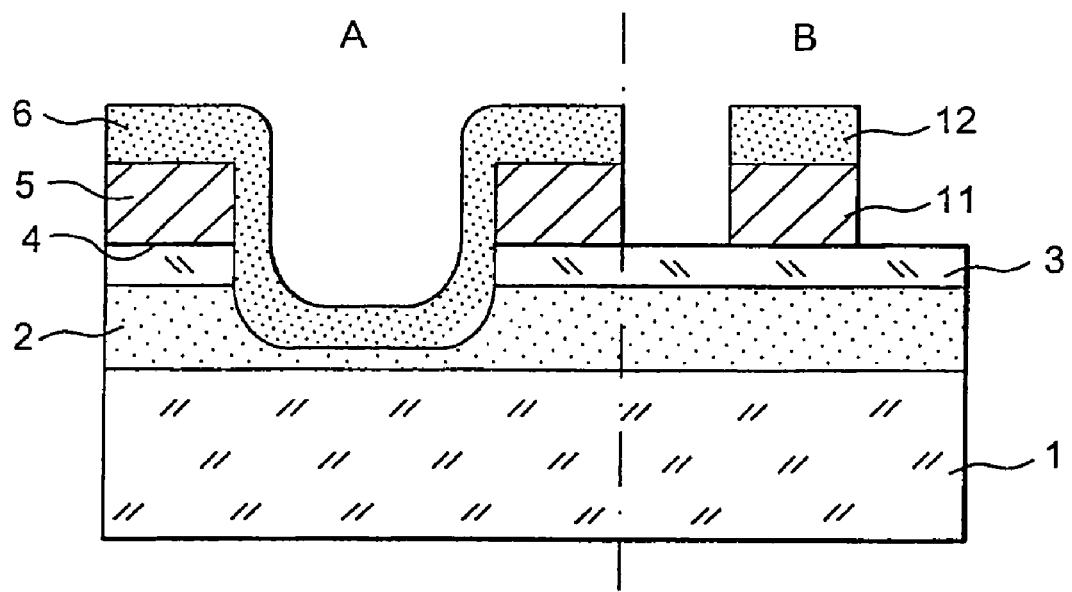
Figure 6:
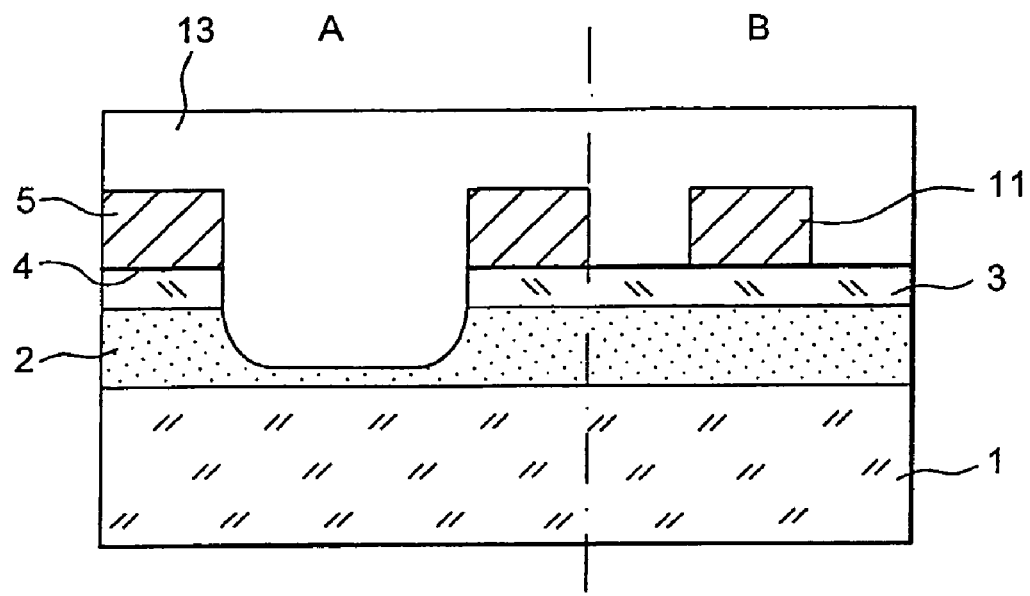
Figure 7:
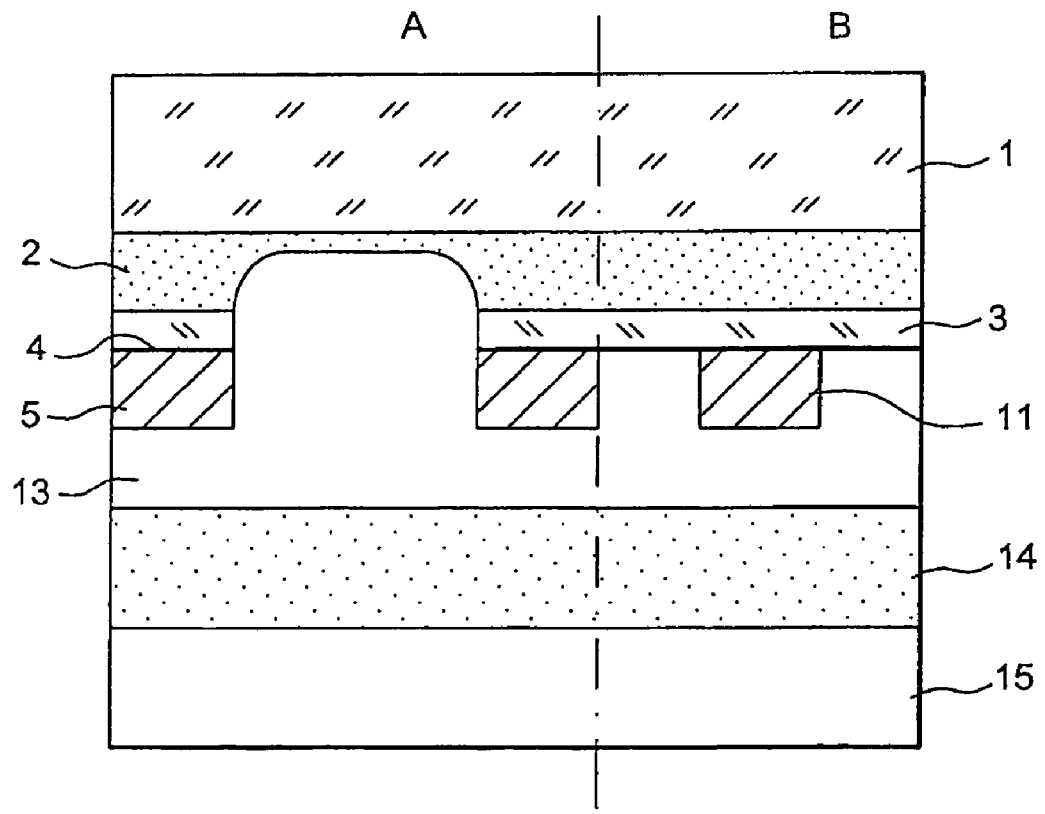

A resin layer 10 is then deposited in order to partially fill the marking 8 (cf. FIG. 4). An optical or electronic lithography step then allows the location 9 of a first gate to be defined. During this lithography step, the location 9 of the first gate is aligned on the marking 8. The resin layer 6 located in the B portion of the structure is then insulated by a lithography method and developed in order to define the location of the patterns to be etched. The layer 5 is then etched, for example by plasma etching, at locations where the resin has disappeared, in order to make a first gate 11 covered with a resin layer 12 (cf. FIG. 5). The resin layer 12 is then removed. A first bonding oxide layer 13 is then deposited, for example by spraying or by chemical vapour deposition, commonly called CVD, in order to fill the space which defines the marking as well as the etched areas which surround the gate (cf. FIG. 6). The first bonding oxide layer 13 is then flattened. The obtained structure following the operation for depositing and smoothing the layer 13 is then turned over and the free face of the layer 13 is bonded, by molecular bonding (oxide on oxide), onto a second bonding oxide layer 14 which covers a transfer substrate 15 (cf. FIG. 7).

Figure 8:
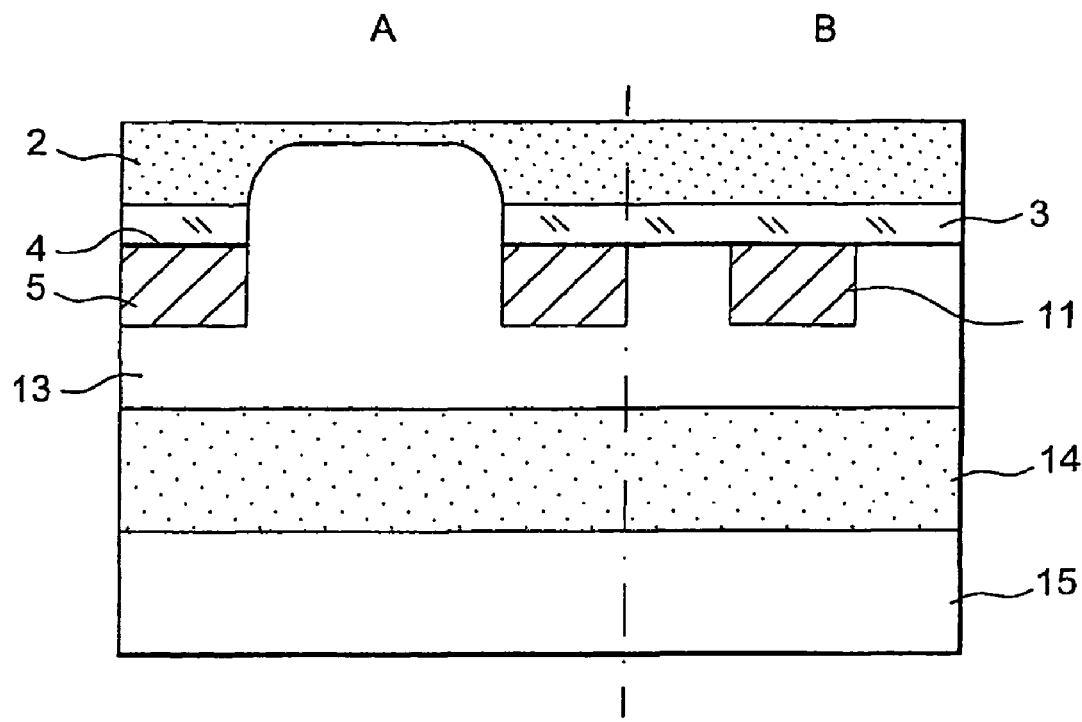
Figure 9:
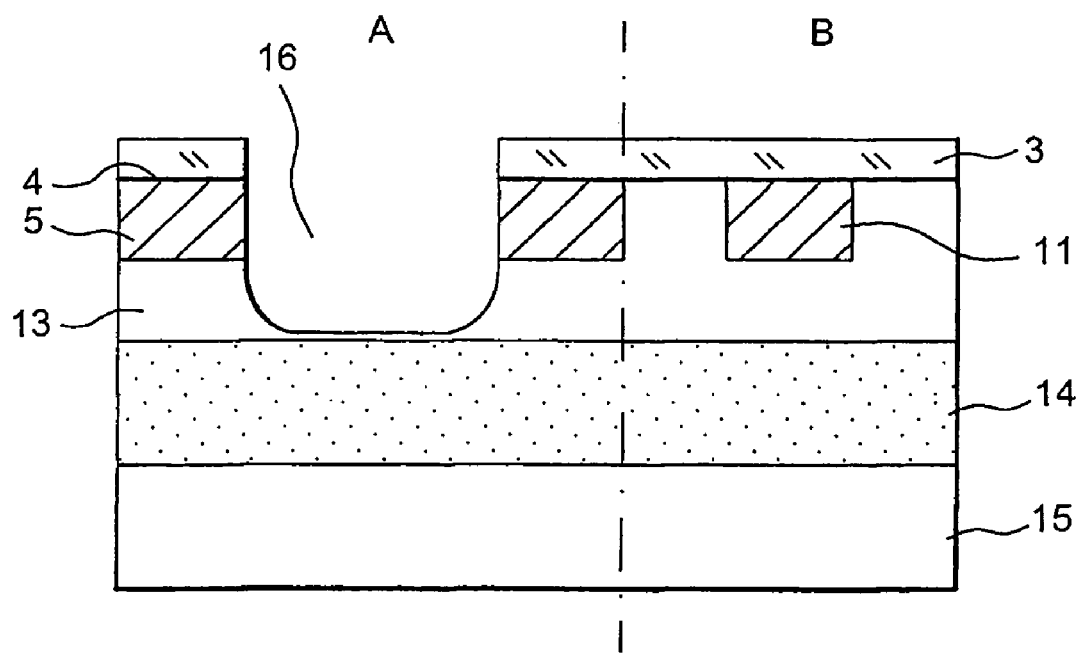

The silicon substrate 1 is then removed by rectification followed by chemical etching, for example by TMAH (Tetra Methyl Ammonium Hydroxide) etching, and stopping on the buried buffer layer 2 (cf. FIG. 8). The buffer layer 2 is then removed with a wet method and the first bonding oxide layer 13 is etched. A marking 16 is thereby made at the same place as the marking 8 (cf. FIG. 9).

Figure 10:
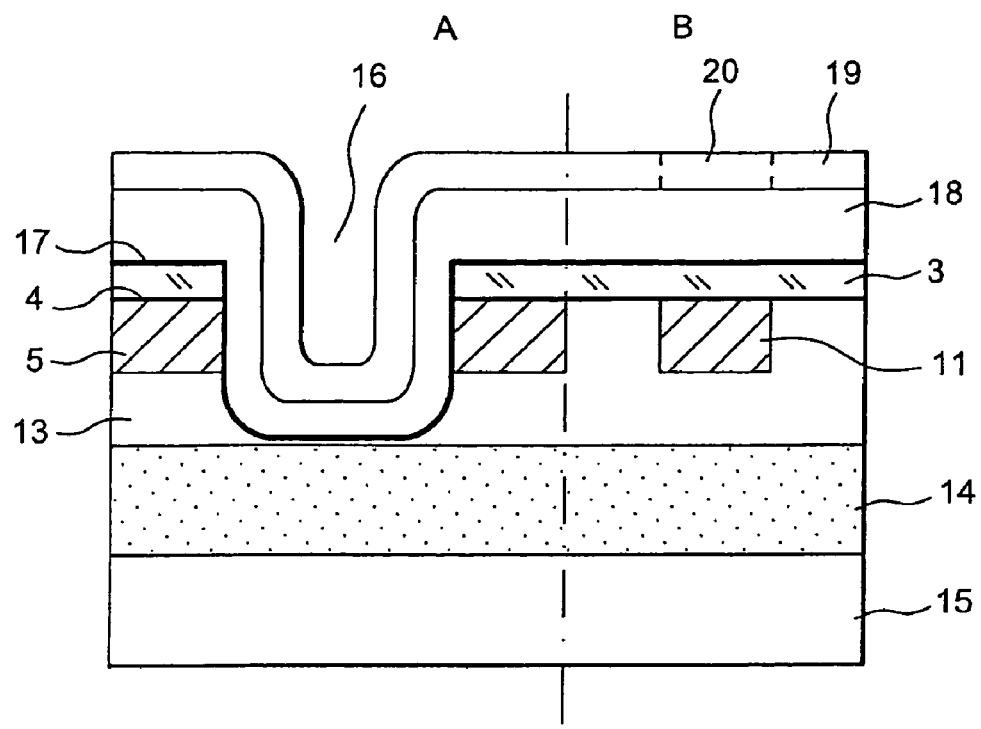
Figure 11:
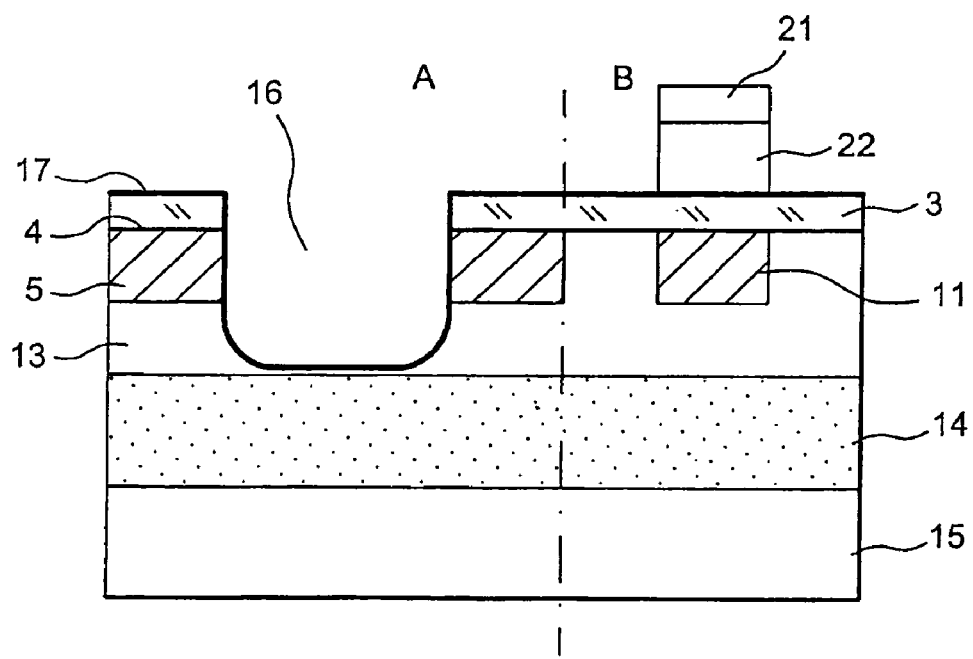

The silicon layer 3 and the inside of the marking 16 are then successively covered with a second gate oxide layer 17, with a second pattern layer 18 and with a resin layer 19 (cf. FIG. 10). As it will appear below, the pattern layer 18 is the layer in which the second pattern is formed. An optical or electronic lithography step then allows the location 20 of a second gate to be defined relatively to the marking 16. As the marking 16 is made at the same place as the marking 8, the location of the second gate is thereby aligned with the location of the first gate. The resin layer 19 and the second pattern layer 18 are then etched, for example, by plasma etching, in order to make the second gate 22 covered with a resin layer 21 (cf. FIG. 11).

Figure 12:
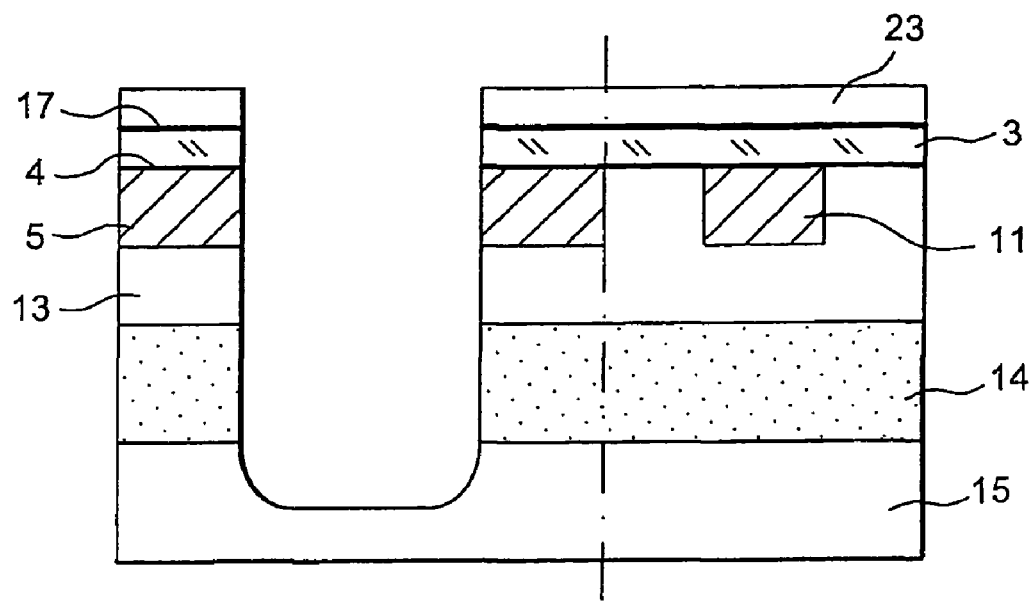
FIGS. 12 and 13 illustrate an alternative of the first embodiment illustrated in FIGS. 1-11.
Figure 13:
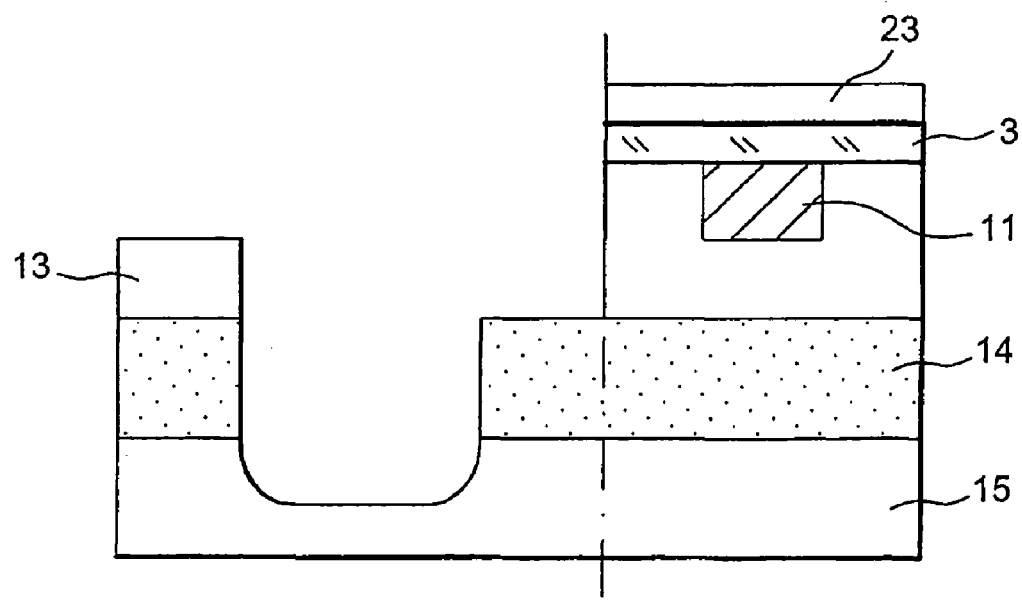

FIGS. 12 and 13 illustrate an alternative method of method illustrated in FIGS. 1-11.

According to this alternative, during the formation of the second marking 16, the latter is transferred into the transfer substrate 15, as this appears in FIG. 12. The thin silicon film 3 is then used as a mask to anisotropic etching of the oxide by a plasma, selectively to silicon. Next, the oxide defines a mask for the anisotropic etching of the silicon of the transfer substrate, the B portion on which the gate is made, being protected with a resin layer 23 during this step (cf. FIG. 13).

FIGS. 14-20 illustrate different steps of a second embodiment of the method for aligning patterns according to the invention. According to this second embodiment, formation of the first marking is carried out before depositing the first pattern layer.

Figure 14:
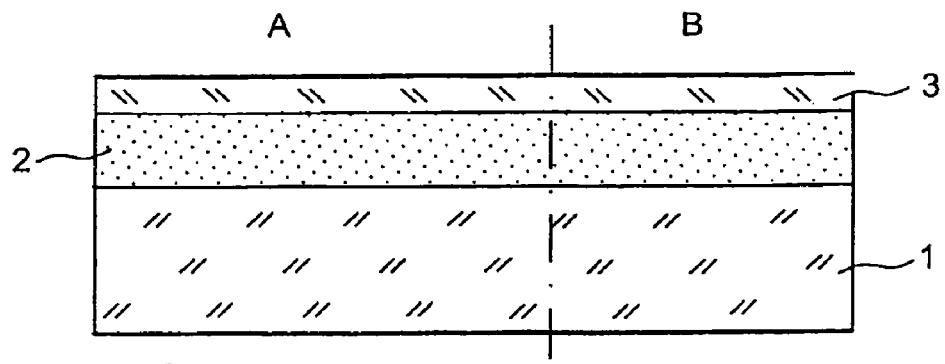
FIGS. 14-20 illustrate different steps of a second embodiment of the method for aligning patterns according to the invention.
Figure 15:
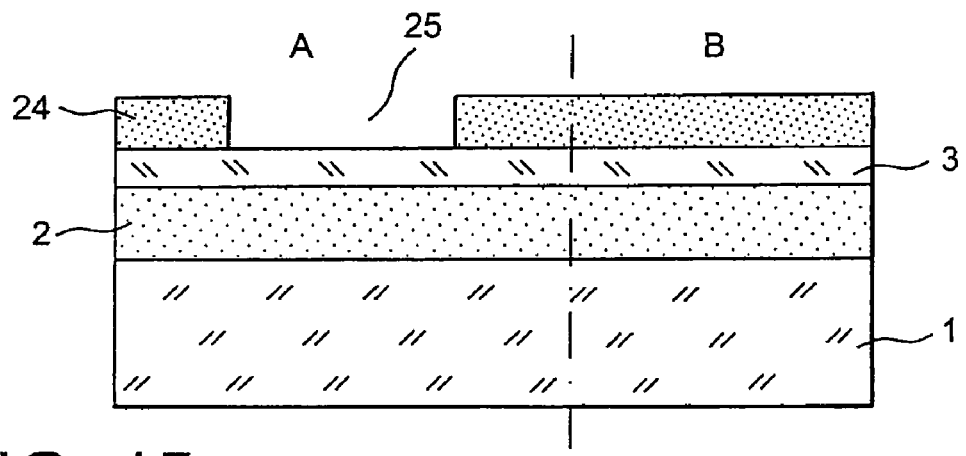
Figure 16:
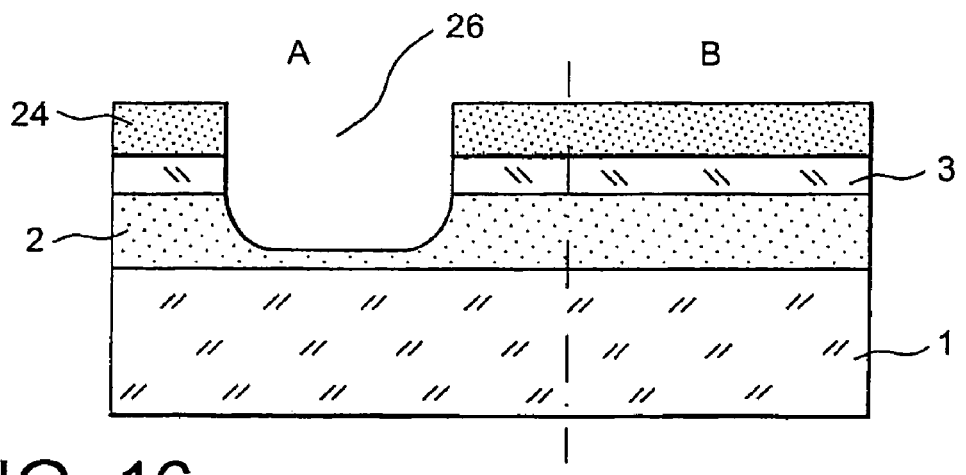
Figure 17:
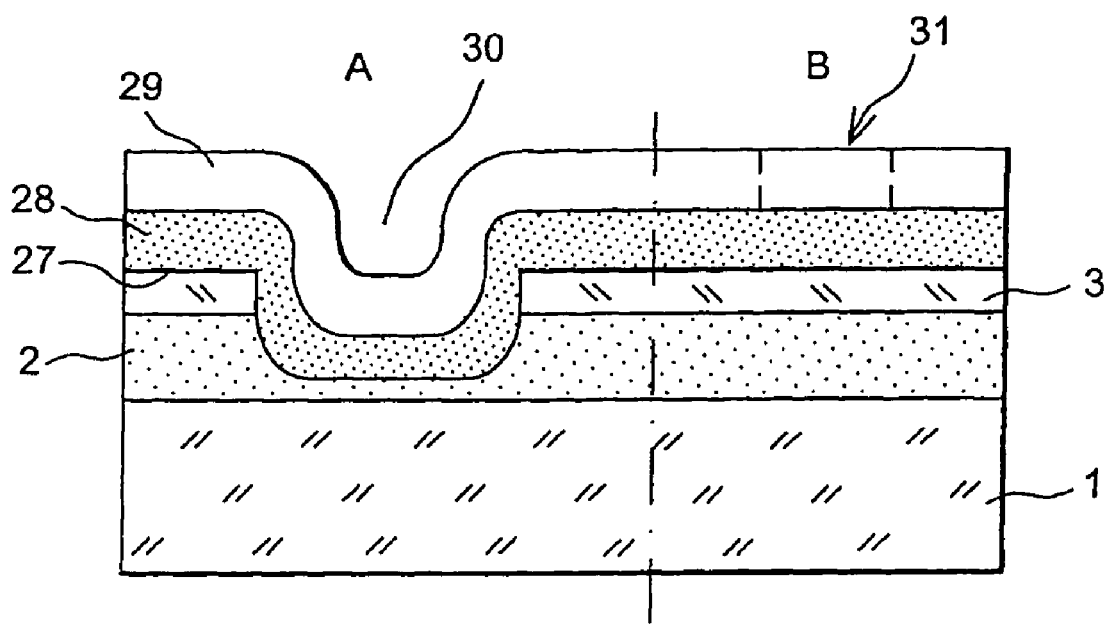
Figure 18:
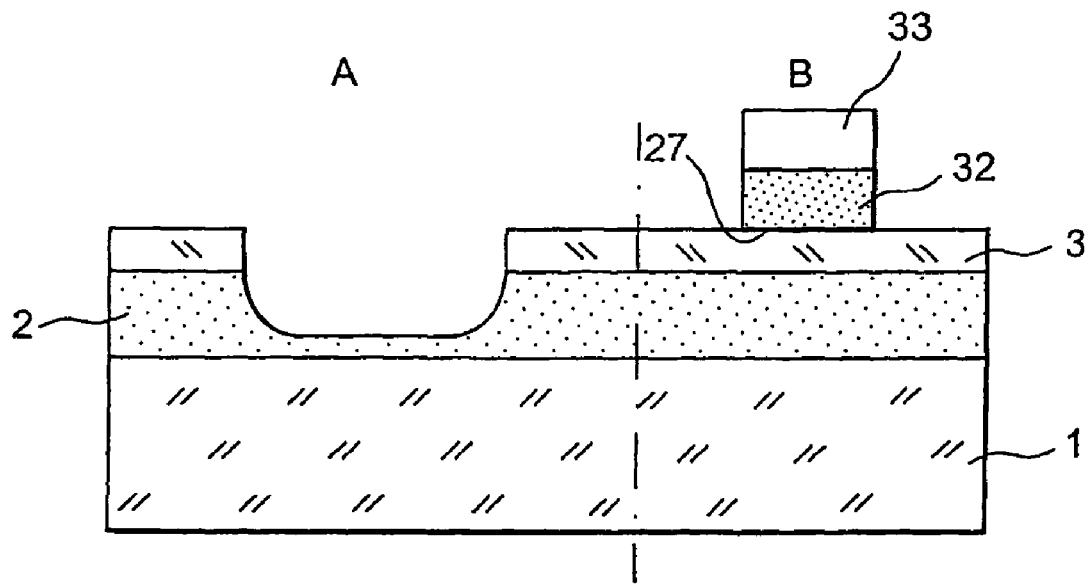
Figure 19:
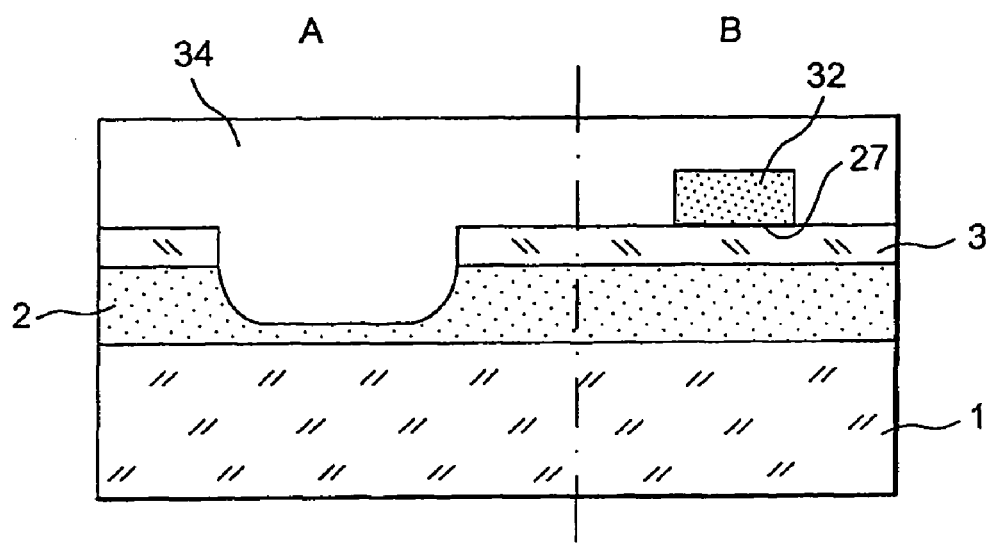
Figure 20:
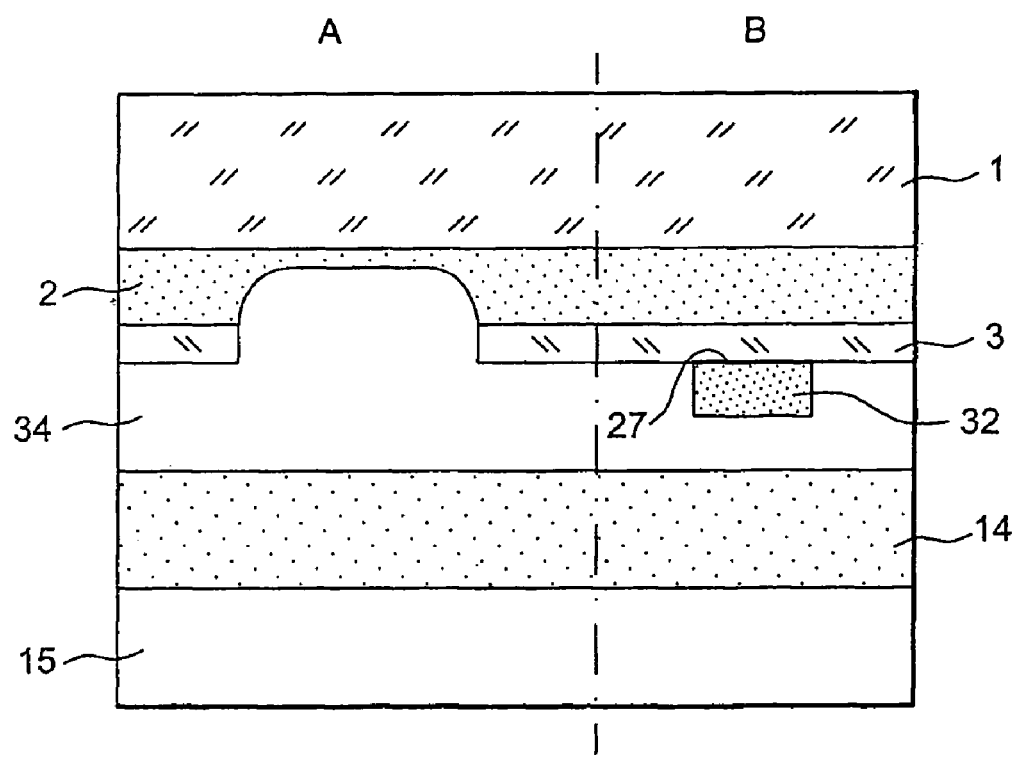

The starting structure then consists of the substrate 1, the buffer layer 2 and the thin layer 3 (cf. FIG. 14). A resin layer 24 is first of all deposited on the thin layer 3 and etching the resin layer 24 causes the position 25 of the first marking to appear (cf. FIG. 15). The thin layer 3 and the buried buffer layer 2 are etched in order to form the first marking 26 (cf. FIG. 16). The resin layer 24 is then suppressed and a gate oxide layer 27, a first pattern layer 28 and a resin layer 29 are successively deposited on the structure obtained after forming the first marking 26 (cf. FIG. 17). An optical electronic lithography step allows the location 31 of a first gate to be defined (cf. FIG. 17). During the lithography step, the location 31 of the first gate is aligned on the marking 26. A first gate 32 covered with a resin layer 33, is then formed (cf. FIG. 18). The resin layer 33 is then removed and a first bonding oxide layer 34 is deposited and flattened (cf. FIG. 19). The obtained structure is then turned over and the free face of the layer 34 is bonded by molecular bonding (oxide on oxide) onto a second bonding oxide layer 14 which covers a transfer substrate 15 (cf. FIG. 20).

The formation of the second marking is then carried out as illustrated in FIGS. 8-11, with also the alternative relative to the transfer of the second marking in the transfer substrate, as illustrated in FIGS. 12 and 13. The illustrative figures of the formation of the second marking and of the transfer of the second marking in the transfer substrate have not been illustrated in order not to make the description needlessly complicated.

An advantage of the second embodiment of the invention is the possibility of using the first marking for making patterns both in the thin film and in the first pattern layer. It is then possible to gain precision in aligning patterns relatively to each other. As a non-limiting example, in the case when the pattern in the thin film is a transistor active area and when the first pattern layer is the gate layer of the transistor, by gaining precision in alignment, the access resistors may be reduced notably in the case of narrow transistors, since it is then possible to reduce the margin on the dimensions of the active area which is very resistive.

The invention claimed is:

1. A method for forming patterns aligned on either side of a thin film deposited on a substrate, the method comprising local etching of the thin film in order to form a first marking characterized in that it comprises:

depositing a first pattern layer on the thin film, deposition of the first pattern layer preceding or following local etching of the thin film, a first lithography step for defining a location of a first pattern, with alignment of the first pattern location relatively to the first marking, local etching of the first pattern layer in order to form a first pattern, depositing a first bonding layer for covering the first marking and the first pattern, turning over the obtained structure following the deposition of the first bonding layer, suppressing the substrate, a step for etching the first bonding layer in order to form a second marking at the location of the first marking, a step for depositing a second pattern layer, a second lithography step for defining a location of a second pattern, with alignment of the second pattern location relatively to the second marking, and a step for etching the second pattern layer in order to form the second pattern.

2. The method for forming patterns according to claim 1, characterized in that the turning over of the structure is followed by a bonding step for bonding the first bonding layer with a second bonding layer which covers a transfer substrate.

3. The method according to claim 2, characterized in that, as the first and second bonding layers are oxide layers, bonding is a molecular bonding.

4. The method according to claim 2, characterized in that the second marking is transferred into the transfer substrate.

5. The method according to claim 1, characterized in that the local etching of the first and second pattern layers is plasma etching.

6. The method according to claim 1, characterized in that the first and the second pattern layers are layers of polycrystalline silicon, or metal, or nitride or silicon, or silica.

7. The method according to claim 1, characterized in that the thin film is semiconductor thin film.

8. The method according to claim 7, characterized in that the semiconductor thin film is silicon, gallium arsenide, or SiGe film.

9. The method according to claim 7, characterized in that the local etching of the semiconductor thin film is wet chemical etching or anisotropic plasma etching.

10. The method according to claim 7, characterized in that it comprises a step for forming a first gate oxide layer between the semiconductor thin film and the first pattern layer and in that the step for depositing the second pattern layer is preceded by the deposition of a second gate oxide layer on the semiconductor thin film.

11. The method according to claim 10, characterized in that the first pattern and the second pattern are transistor gates.

12. The method according to claim 1, characterized in that the thin film is a metal thin film.

13. The method according claim 12, characterized in that the metal thin film is TiN or W film.

14. The method according to claim 1, characterized in that the first and second lithography steps are optical or electronic lithography steps.

15. The method according to claim 1, characterized in that it comprises the formation of a buried buffer layer between the thin film and the substrate.

16. The method according to claim 15, characterized in that the buried buffer layer is a $SiO_2$ or SiGe layer.

* * * * *